United States Patent [19]

Vogt et al.

[11] Patent Number: 5,105,193
[45] Date of Patent: Apr. 14, 1992

[54] DIGITAL TO ANALOGUE CONVERTORS

[75] Inventors: Alexander W. Vogt, London; Ian J. Dedic, Northolt, both of England

[73] Assignee: Marconi Electronic Devices limited, England

[21] Appl. No.: 304,950

[22] Filed: Feb. 1, 1989

[30] Foreign Application Priority Data

Feb. 15, 1988 [GB] United Kingdom ............... 8803431

[51] Int. Cl.$^5$ .................... H03M 1/78; H03M 1/06
[52] U.S. Cl. .................................... 341/154; 341/136; 341/118; 341/144
[58] Field of Search ............... 341/144, 145, 136, 154, 341/118

[56] References Cited

U.S. PATENT DOCUMENTS

| 4,338,592 | 7/1982 | Wilensky | 341/118 |
| 4,393,370 | 7/1983 | Hareyama | 341/148 X |
| 4,635,038 | 1/1987 | Wincn | 341/136 |
| 4,665,381 | 5/1987 | Masuda et al. | 341/145 |
| 4,667,178 | 5/1987 | Ryu | 341/136 |
| 4,918,447 | 4/1990 | Michel | 341/144 |

Primary Examiner—A. D. Pellinen
Assistant Examiner—Sharon D. Logan
Attorney, Agent, or Firm—Kirschstein, Ottinger, Israel & Schiffmiller

[57] ABSTRACT

A high-speed digital to analogue convertor includes a matrix of cells each including a current source, in which there are provided local decode circuitry within each cell to bring into operation simultaneously all those current sources required to decode any one value.

1 Claim, 2 Drawing Sheets

DIGITAL TO ANALOGUE CONVERTORS

BACKGROUND OF THE INVENTION

1. Field of the Invention

The present invention relates to digital to analogue convertors.

DESCRIPTION OF RELATED ART

A high speed digital to analogue convertor for, say, video applications may comprise an array or matrix of substantially identical current sources all having their outputs connected in common to the output of the convertor. Digital decoding circuits are utilised to determine how many of the sources are brought into operation in response to any one digitally coded input signal to produce a total analogue output current of the appropriate magnitude. The decoding circuits must allow each source in the matrix to be accessed.

The matrix may be made up of a set of cells each comprising local decoding, control circuitry and a current source, and these cells may be addressed by means of column and row decoding circuits.

Known decoders of this form suffer from the effects of different delays in the various decoding paths between the digital signal input and the respective current sources, because of which the current sources switch on or off at different times, causing glitches on the output path during transitions between input codes, settling problems and output transients that are dependent upon the input codes.

SUMMARY OF THE INVENTION

According to one aspect of the present invention in a digital to analogue convertor comprising a plurality of current sources each arranged selectively to supply a current of a predetermined magnitude to a common output path and means to enable a respective number of said current sources in dependence upon the value represented by a digitally coded input signal to said convertor, there are provided means associated with each of said current sources to bring into operation substantially simultaneously all of said sources that are so enabled.

According to another aspect of the present invention a digital to analogue convertor comprises a matrix of cells each including a respective current source and respective switching means, each of said current sources being arranged selectively to supply a current of a predetermined magnitude to a common output path upon operation of the respective switching means, and means selectively to enable a plurality of said current sources in dependence upon a value represented by a digitally coded input signal to said convertor.

The convertor may comprise an array or matrix of cells each comprising one of said current sources and respective switching means by which the respective current source may be brought into operation. Each cell may also include respective decoding means by which the respective current source may be enabled in response to appropriate digitally coded input signals.

BRIEF DESCRIPTION OF THE DRAWINGS

A digital to analogue convertor in accordance with the present invention will now be described by way of example with reference to the accompanying drawings, of which.

DETAILED DESCRIPTION OF THE PREFERRED EMBODIMENT

Figure 1:
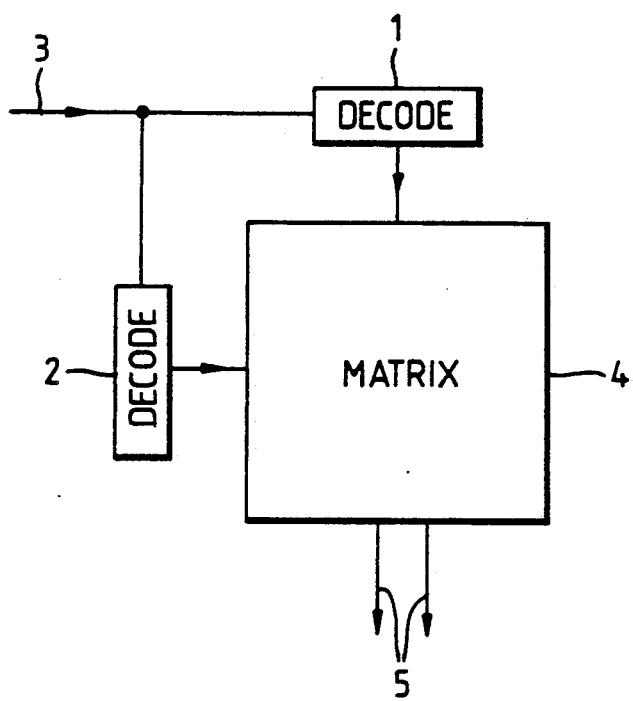
FIG. 1 shows the convertor schematically.

Referring first to FIG. 1 the convertor comprises column decoding means 1 and row decoding means 2 responsive to a digitally coded input signal on an input path 3 to bring into operation a number of current sources (not shown) in an array or matrix 4 to produce on an output path 5 a current of a magnitude dependent upon the value represented by the digitally coded input signal. The matrix 4 may comprise, say, 64 cells (not shown) each including a current source, to enable the digital to analogue conversion of a six-bit linearly coded input signal.

Figure 2:
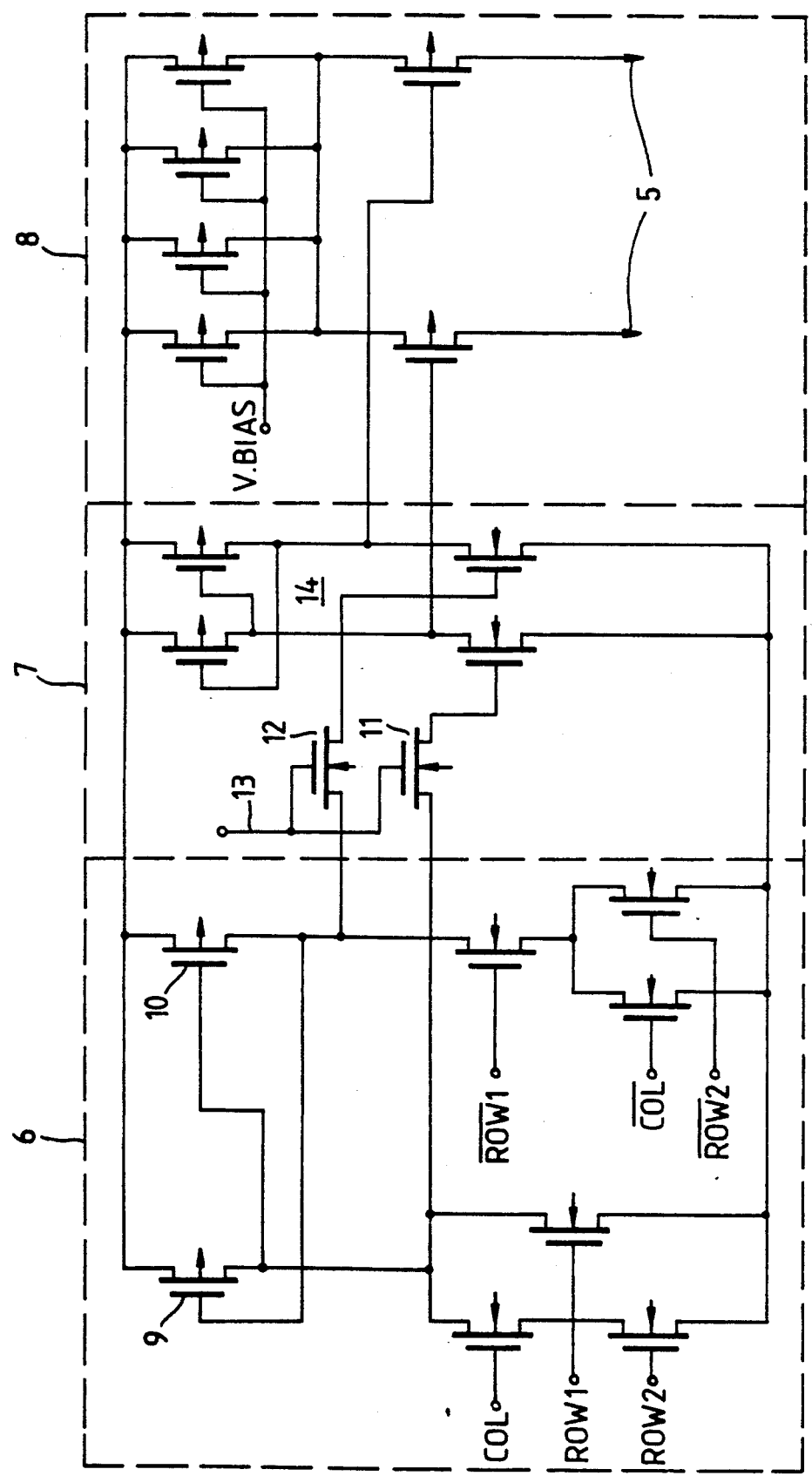
FIG. 2 shows diagramatically part of the convertor of FIG. 1.

Referring to FIG. 2, each cell comprises a local decode circuit 6, a switch drive circuit 7 and a current source 8. As shown, the decode circuit 6 is responsive to one column address bit and its inverse and two row address bits and their inverses to set the condition of a pair of cross-coupled p-channel devices 9 and 10.

During transitions between one coded input signal and the next, while the row and column and local decoding circuits are settling, a pair of series n-channel devices 11 and 12 are switched to a non-conducting condition by means of a control signal applied in common to all cells of the matrix by way of a path 13, and a half-latch circuit 14 maintains the current source 8 in its existing state. Once the decoding circuits have settled the devices 11 and 12 in all cells are switched into conduction substantially simultaneously by way of the path 13, whereby the half latches 14 and the current sources 8 in all cells are switched substantially simultaneously to the condition required by the new digitally coded input signal.

The combination of circuits shown in FIG. 2 produces a structure with a minimum number of p-channel devices and n-p cross-overs, compact layout and a minimum capacitance loading on control and decode paths.

Integral non-linearity may be reduced, at the expense of differential non-linearity, by interleaving the signals selecting specific rows or specific columns. Instead of selecting rows, for example, in the order, 1,2,3,4,5,6,7,8 they may be selected in the order 4,5,3,6,2,7,1,8, and the same for the columns. This interleaving reduces the effects of gradients of properties across the matrix. It can also be regarded as randomising the selection of individual current sources.

The switching of all current sources together results in minimal glitches and transients which in general are not code-dependent.

As shown in the drawing the current sources produce both the required current and its inverse or complement, the latter being applied to a dummy load, in order to even out the current loading on the power supply.

We claim:

1. A digital to analogue converter arrangement, comprising: a matrix of cells, each including a respective current source and row and column decoding circuits responsive to a digitally coded input signal to derive row and column address signals for cells of said matrix, each of said cells including local decoding circuit means responsive to address signals from said row and column decoding circuits for taking up a condition dependent upon a value represented by said digitally coded input signal; latch circuit means having outputs; means connecting the outputs of said latch circuit means to the respective current source, for defining the state of operation of the respective current source; switch means for connecting outputs of said local decoding circuit means to the latch circuit means, for setting the latch circuit means to a state corresponding to the condition taken up by said local decoding circuit means; and means for applying operating signals to said switch means in all cells of the matrix substantially simultaneously when the decoding circuit means have settled.

* * * * *